United States Patent
Desprez-Le Goarant et al.

(10) Patent No.: US 7,486,138 B2
(45) Date of Patent: Feb. 3, 2009

(54) BIPOLAR AUDIO SIGNAL SWITCH

(75) Inventors: Yann Desprez-Le Goarant, Singapore (SG); Kok-Yong Tan, Singapore (SG)

(73) Assignee: STMicroelectronics Asia Pacific Pte Ltd., Singapore (SG)

( * ) Notice: Subject to any disclaimer, the term of this patent is extended or adjusted under 35 U.S.C. 154(b) by 823 days.

(21) Appl. No.: 10/703,099

(22) Filed: Nov. 6, 2003

(65) Prior Publication Data

US 2004/0150461 A1 Aug. 5, 2004

(51) Int. Cl.
*H03F 3/04* (2006.01)
*H03F 3/16* (2006.01)
*H03F 3/45* (2006.01)
*H03G 3/00* (2006.01)
*H02B 1/00* (2006.01)

(52) U.S. Cl. .............. 330/250; 330/299; 330/300; 330/254; 330/278; 381/123

(58) Field of Classification Search ........... 381/123; 330/299, 300, 254, 278, 250
See application file for complete search history.

(56) References Cited

U.S. PATENT DOCUMENTS 4,639,685 A * 1/1987 Saller et al. ............ 330/263
2004/0150461 A1 * 8/2004 Desprez-Le Goarant et al. . 327/478

* cited by examiner

*Primary Examiner*—Vivian Chin
*Assistant Examiner*—George C Monikang
(74) *Attorney, Agent, or Firm*—Lisa K. Jorgenson; David V. Carlson

(57) ABSTRACT

An audio signal switch has a plurality of inputs and an output. Each input is arranged to be selectively connected to the output via a respective transmission chain, each transmission chain includes: a first bipolar transistor, of a first type, connected to the input; a second bipolar transistor, of a second type, complementary to said first configuration, connected to the output; and an intermediate bipolar transistor, of the second type, connected between said first and second transistors. The first and second transistors are arranged in an emitter-follower circuit configuration, and the intermediate transistor is arranged to act as a diode to protect the first transistor from a large reverse voltage applied to its base-emitter junction.

19 Claims, 2 Drawing Sheets

BIPOLAR AUDIO SIGNAL SWITCH

BACKGROUND OF THE INVENTION

1. Field of the Invention

The present invention relates to an improved audio signal switch. Audio switches are used widely in home and professional audio equipment such as amplifiers and home entertainment units.

2. Description of the Related Art

In current audio-visual (AV) systems, it is frequently desirable to be able to select one of a plurality of analog audio sources for connection to an amplifier and thence to one or more loudspeakers. Example sources include audio tape players, CD players, DVD players, video tape players, radios, mini-disc players, MP3 players, video game consoles and televisions. Many current AV systems include seven or more audio input connections.

A problem with such AV systems is the disparity in signal levels which are produced by different audio sources. For instance, the SCART specification allows audio signals to be $2_{rms}(\equiv 5.6 V_{peak-peak})$, while a typical Video Analog source is only a maximum of $1.4 V_{peak-peak}$.

Prior art solutions include use of a CMOS switch, i.e., a standard CMOS transmission gate including NMOS and PMOS transistors arranged in parallel. This configuration is limited in that the MOS operating voltage needs to be higher than the signal amplitude to be switched, thus limiting this solution to cases where the amplitude of the signal(s) to be switched does not exceed the value of $V_{DD}$, which is typically 5V.

In order to overcome the problem of the above described arrangement, certain systems employ selective matched attenuation and amplification. The incoming analog signal is attenuated by a pre-determined amount pre-switching, and then selectively amplified post-switching to re-create the original level of the signal. This allows the signal which is actually switched to be within the operating range of the CMOS devices. However, aside from the extra components introduced by such a scheme, errors will be introduced by the signal dividers used, which are commonly resistors. Typical devices will introduce a 1% error due to component value mismatch. This error is introduced into both AC and DC values. The AC error does not generally matter, but the DC error will be different for each source and thus creates a signal discontinuity which presents itself as an audible commutation 'pop' upon switching. Such a 'pop' is not generally acceptable and requires further additional processing, such as offset cancellation and smoothing, to rectify the situation.

A solution to this problem uses bipolar transistors arranged in an emitter follower configuration. Since such devices do not use the gate of CMOS components, which is the main voltage limitation of sub-micron MOS devices, it is possible to use relatively high-voltage bipolar components in a sub-micron BiCMOS process.

FIG. 1 shows such a prior art attempt to solve the problem of audio source switching. The circuit is arranged to switch between two input audio sources 100, 105. Although only two input sources are shown for clarity, the skilled person will realize that appropriate modifications may be made to allow for switching between any number of input audio sources.

The input sources 100, 105 are connected to the base of respective transistors 125, 120. The collector of each transistor is connected to a voltage supply $V_{cc}$. The emitter of each transistor is connected to one terminal of a respective current source 110, 115. The other terminal of the current source is connected to a ground potential.

The emitter of each transistor 125, 120 is further connected to the base of a further respective transistor 140, 145. In addition to said connections between said emitter of transistors 125, 120 and said bases of said transistors 140, 145, there is a switch arrangement 130 which is operable to selectively connect said intermediate connection to $V_{cc}$. In the case of more than two input sources, the switch is arranged to selectively connect all unwanted inputs to $V_{cc}$. Whichever connection is selected by said switch dictates which input audio source 100, 105 is presented at the output 150 of the switch circuit.

The emitters of transistors 140, 145 are connected together to a first terminal of a current source 135. The other terminal of current source 135 is connected to $V_{cc}$. The collectors of transistors 140, 145 are connected to a ground potential. The Emitters of transistors 140, 145 are connected together to the output port 150.

Transistors 125, 120 are NPN (vertical structure), and in conjunction with current sources 110, 115 either transistor 125, 120 will operate as an emitter follower depending on the status of switch 130. The switch 130 ensures that the inoperative transistor remains inactive. Either one of transistors 140, 145 in conjunction with current source 135 also operate as an emitter follower, depending which transistor is active, which is again controlled by switch 130.

The inputs 100, 105 are configured to share a common biasing system so that there is a minimal DC offset between the inputs. The input signal is generally AC-linked.

In FIG. 1, with the switch in the position shown, input 105 is selected. The position of the switch has the effect of shorting the emitter of transistor 125 and the base of transistor 140 to $V_{cc}$, thus disabling input 100.

A problem with the circuit of FIG. 1 is that the vertical bipolar transistor structure is not able to accept a very high reverse voltage for the emitter-base junction, unlike the base-collector junction—the maximum $V_{EB}$ is lower than the maximum $V_{CB}$. This means that the amplitude of the switched signal is limited, and renders the circuit of FIG. 1 unsuitable for analog audio signal amplitudes.

In an attempt to remedy the problems with the circuit of FIG. 1, the circuit of FIG. 2 has been proposed. It has the same basic structure as the circuit of FIG. 1, and similar reference numerals refer to similar components. It differs to the circuit of FIG. 1 in that there is a diode 255, 260 connected between the base and emitter of transistors 225 and 220 respectively. The effect of the diodes 255, 260 is to limit the reverse biasing of the transistors 225, 220, $V_{BE}$ to $-V_d$, where $V_d$ is equal to the diode voltage drop.

However, this solution introduces a new problem in that the non-selected input 200 sees its voltage shifted by diode 255 to $(V_{cc}-V_d)$. That has the effect that if the non-selected input is selected by switch 230, there will be a perturbation of the signal during restoration of the DC level, with additional current flowing from the forward biased diode. This perturbation occurs during signal selection and has an adverse effect on audio signal quality.

Therefore, there is a specific problem with the amplitude levels of audio signals in that they exist over a wide range, and this problem is further exacerbated by problems introduced by the trend towards reduced operating voltages for integrated circuits, which makes it problematic to interface with signals at levels in excess of supply voltage.

The circuits of FIGS. 1 and 2 address some of the problems of earlier prior art solutions, but also introduce problems of their own.

BRIEF SUMMARY OF THE INVENTION

A first embodiment of the present invention provides an audio signal switch having a plurality of inputs and an output, wherein each input is arranged to be selectively connected to the output via a respective transmission chain, each transmission chain including:

a first bipolar transistor, of a first type, connected to the input;

a second bipolar transistor, of a second type, complementary to the first configuration, connected to the output; and an intermediate bipolar transistor, of the second type, connected between the first and second transistors, wherein the first and second transistors are arranged in an emitter-follower circuit configuration, and the intermediate transistor is arranged to act as a diode to protect the first transistor from a large reverse voltage applied to its base-emitter junction.

Preferably, the first transistor is coupled to a current source to maintain an operative bias condition.

Preferably, the second transistor is coupled to a current source to maintain an operative bias condition.

Preferably, the intermediate transistor is arranged to have a short-circuited base-collector junction and is coupled to a current source to maintain an operative bias condition.

Preferably the switch includes a switch element operable to selectively connect the output of the intermediate transistor to a fixed potential.

In a first preferred embodiment the first type is NPN, and the second type is PNP.

In a second preferred embodiment, the first type is PNP, and the second type is NPN.

Many embodiments of the present invention overcome or at least ameliorate problems discussed in relation to the prior art audio signal switches.

In particular, many embodiments of the present invention ensure that the voltage level seen at each input is maintained, and thus, no commutation 'pop' will be experienced on switching between inputs.

BRIEF DESCRIPTION OF THE DRAWINGS

For a better understanding of the present invention and to understand how the same may be brought into effect, the invention will now be described by way of example only, with reference to the appended drawings in which.

DETAILED DESCRIPTION OF THE INVENTION

Figure 2:
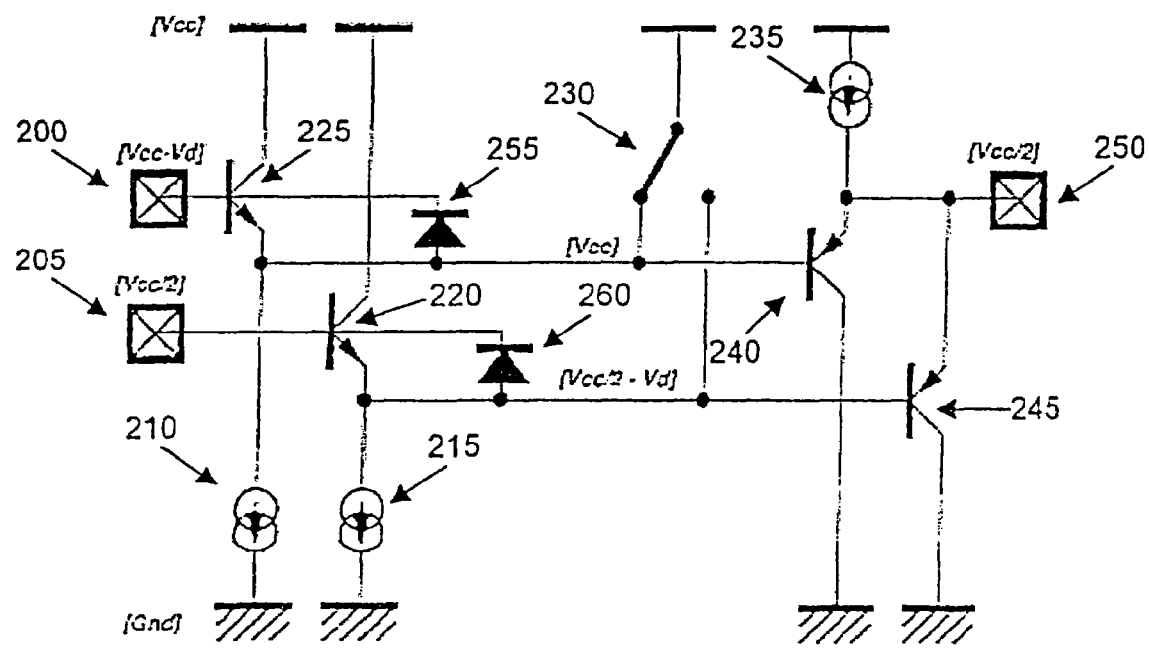
FIG. 2 shows a circuit layout of the bipolar switch of FIG. 1 with added diode protection known in the prior art.
Figure 3:
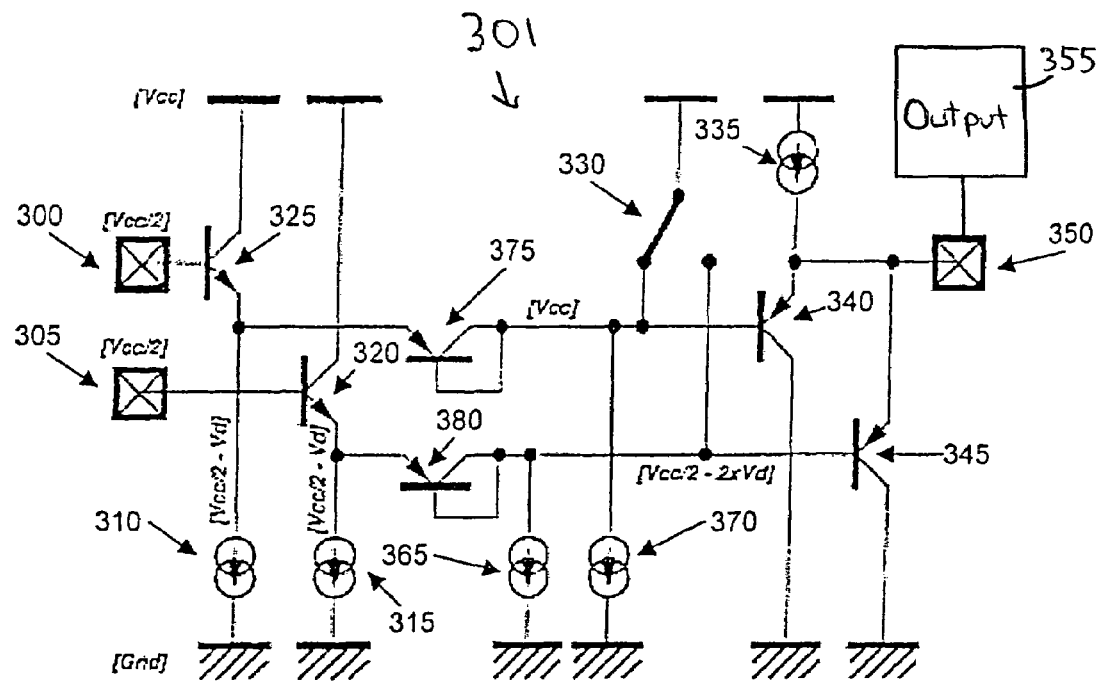
FIG. 3 shows an embodiment of the invention.

FIG. 3 shows an audio signal switch 301 according to a first embodiment of the present invention. The switch 301 is connected between first and second audio input sources 300, 305 and an output device 355 that outputs appropriate sounds according to which of the the audio input sources 300, 305 is selected by the switch 301. The basic structure of the switch 301 is similar to the prior art circuits shown in FIGS. 1 and 2, and similar reference numerals refer to similar components.

Figure 1:
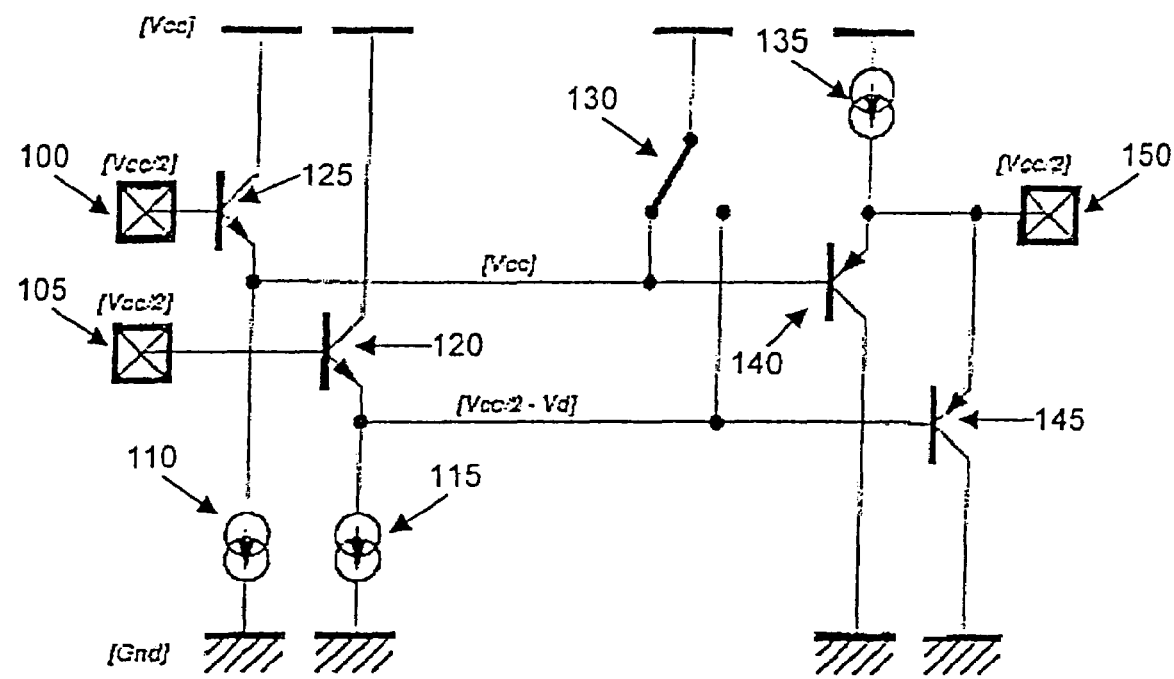
FIG. 1 shows a circuit layout for a bipolar audio switch known in the prior art.

The primary difference between the circuit of FIG. 3 and the prior art circuit of FIG. 1 is the addition of a further transistor connected between transistors 325 and 340 (also 320 and 345).

The following description will describe a single transmission chain between the first input source 300 and an output 350 that is connected to the output device 355. The other transmission chain, between input 305 and 350 is identical in all important aspects and so is not described separately.

Transistor 325 receives input 300 at its base. Its collector is connected to $V_{cc}$, and its emitter is connected via current source 310 to ground. The output from the emitter of transistor 325 is applied to the emitter of PNP transistor 375. The base and collector of transistor 375 are short circuited, and this short-circuited junction is connected to the base of PNP transistor 340. The short circuited junction is further connected to a first terminal of a current source 370 which has a further terminal connected to ground.

Transistor 375 is of the same type (either PNP or NPN) as the output transistor 340. In effect it is acting as a diode, but as it is of the same type as the output transistor, it is able to protect the input transistor 325 from excessive voltage on its base emitter junction.

Transistor 340 has its collector connected to ground, and its emitter connected to a first terminal of a current source 335, which has a further terminal connected to $V_{cc}$.

The output 350 is connected to the emitter of transistor 340, and the emitter of transistor 345 of the other transmission chain.

The additional current sources 365, 370 are provided to maintain the correct bias conditions for transistors 380 and 375, respectively, when the respective transmission chain, and hence, input, are selected by switch 330. The currents supplied by sources 310, 315 are minimal and do not affect circuit performance, or contribute greatly to the power consumption of the circuit. As such, there is no need to increase the ratings of the transistors.

The additional current sources 365, 370 are of similar rating to the current sources 110, 115, 210, 215 as shown in the prior art circuits of FIGS. 1 and 2. They are arranged to offer large biasing currents for the selected input and to ensure good THD performance of the input transistors. The current sources 310 and 315 are arranged to provide minimal bias currents to maintain the forward biasing of transistors 325, 320, and not to provide operational bias currents. The currents provided by current sources 310, 315 are therefore several orders of magnitude lower than the currents provided by the current sources 110, 115, 210, 215 in the prior art circuits.

In use, the non-selected inputs (Input 300 in FIG. 3) maintain a forward biased condition for the base-emitter junction of transistor 325, and a correct DC level at the input 300. This configuration therefore overcomes, or at least ameliorates, the problems experienced through use of the prior art solutions.

The number of inputs, and hence transmission chains, is unlimited, and the basic structure illustrated in FIG. 3 may be utilized with any number of input audio sources.

Figure 4:
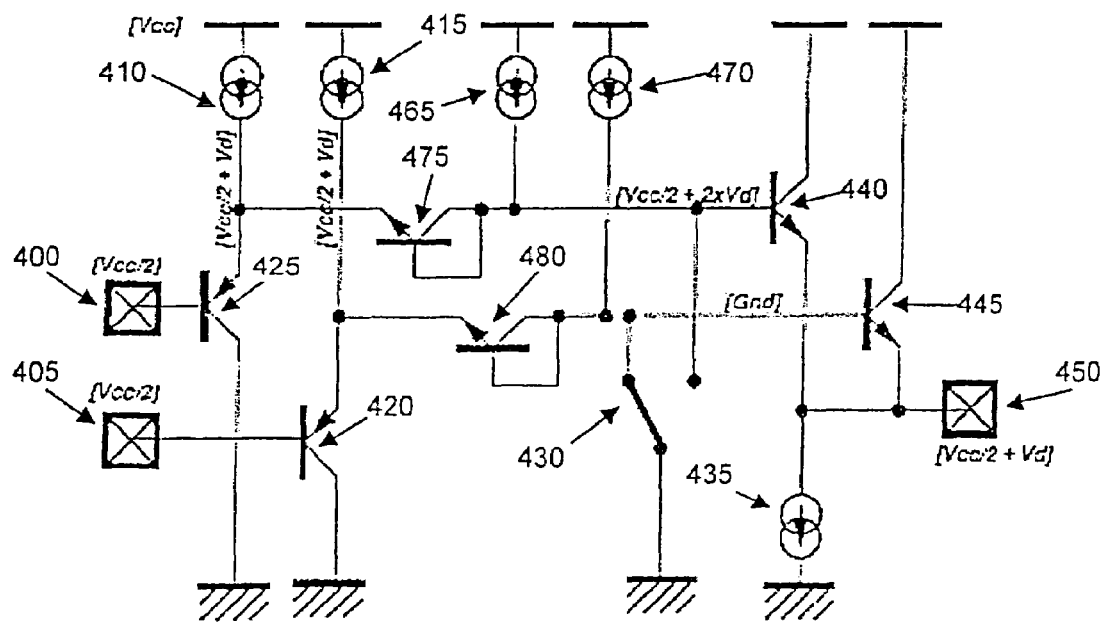
FIG. 4 shows a complementary embodiment of the invention.

FIG. 4 shows a complementary embodiment of the invention where PNP transistors are replaced with NPN transistors and vice versa. The operation of this circuit is essentially identical to that shown in FIG. 3, with account being taken of the device polarities.

Transistors 420 and 425 are PNP transistors of vertical structure, and NPN transistors 475, 480, 440 and 445 are of lateral structure.

In the light of the foregoing description, it will be clear to the skilled man that various modifications may be made within the scope of the invention.

The present invention includes and novel feature or combination of features disclosed herein either explicitly or any generalization thereof irrespective of whether or not it relates to the claimed invention or mitigates any or all of the problems addressed.

All of the above U.S. patents, U.S. patent application publications, U.S. patent applications, foreign patents, foreign patent applications and non-patent publications referred to in this specification and/or listed in the Application Data Sheet are incorporated herein by reference, in their entirety.

The invention claimed is:

1. An audio signal switch, comprising:
   a plurality of inputs;
   an output; and
   a plurality of transmission chains selectively connecting each input to the output, respectively, each transmission chain including:
   a bipolar first transistor, of a first type, connected to the respective input and having a base-emitter junction;
   a bipolar second transistor, of a second type, complementary to said first type, connected to the output;
   a bipolar intermediate transistor, of the second type, connected between said first and second transistors, wherein said first and second transistors are arranged in an emitter-follower circuit configuration, and said intermediate transistor is arranged to act as a diode to protect the first transistor from a large reverse voltage applied to its base-emitter junction; and
   a first current source coupled between a first voltage supply terminal and a first node at which the intermediate transistor is coupled to an emitter of the first transistor to maintain an operative bias condition, the intermediate transistor having a conduction path extending between the emitter of the first transistor and a second node at which the intermediate transistor is coupled to a base of the second transistor.

2. An audio signal switch as claimed in claim 1, further comprising a second current source coupled from a second voltage supply terminal to an emitter of the second transistor to maintain an operative bias condition of the second transistor.

3. An audio signal switch as claimed in claim 1, wherein the intermediate transistor is arranged to have a short-circuited base-collector junction, the audio signal switch including a second current source coupled between the second node and the first voltage supply terminal to maintain an operative bias condition.

4. An audio signal switch as claimed in claim 1, further comprising a switch operable to selectively connect an output of the intermediate transistor to a fixed potential.

5. An audio signal switch as claimed in claim 1 wherein the first type is NPN, and the second type is PNP.

6. An audio signal switch as claimed in claim 1 wherein the first type is PNP, and the second type is NPN.

7. A signal switch, comprising:
   a first input;
   an output;
   a first transistor having a base terminal connected to the first input, a first collector terminal connected to a first voltage reference terminal, and an emitter terminal;
   a second transistor having a base terminal, an emitter terminal connected to the output, and a collector terminal connected to a second voltage reference;
   a first diode having a conduction path coupled between a first node, at which the first diode is coupled to the emitter terminal of the first transistor, and a second node at which the first diode is coupled to the base terminal of the second transistor and arranged to protect the first transistor from a large reverse voltage at the emitter terminal of the first transistor;
   a first current source coupled between the second voltage reference terminal and and the first node; and
   a second current source connected between the second node and the second voltage reference, the first and second current sources being sized such that the second current source provides a current that is at least an order of magnitude greater than a current provided by the first current source.

8. The signal switch of claim 7, further comprising a third current source connected between the second conduction terminal of the second transistor and the first voltage reference.

9. The signal switch of claim 7, further comprising a switch element operable to selectively connect the control terminal of the second transistor to the first voltage reference.

10. The signal switch of claim 7 wherein the first transistor is of a first conductivity type and the second transistor is of a second conductivity type, opposite to the first conductivity type.

11. The signal switch of claim 10, wherein the first type is NPN and the second type is PNP.

12. The signal switch of claim 7 wherein the first transistor is of a first conductivity type; the first diode is a diode-connected transistor of a second conductivity type, opposite to the first conductivity type; and the second transistor is of the second conductivity type.

13. The signal switch of claim 7, wherein the first transistor, second transistor, and first diode are part of a first transmission chain, the signal switch further comprising:
   a second input;
   a second transmission chain connected between the second input and the output, the second transmission chain including:
   a third transistor having a control terminal connected to the second input, a first conduction terminal connected to the first voltage reference, and a second conduction terminal;
   a fourth transistor having a control terminal, a first conduction terminal connected to the output, and a second conduction terminal connected to the second voltage reference; and
   a second diode connected between the second conduction terminal of the third transistor and the control terminal of the fourth transistor and arranged to protect the third transistor from a large reverse voltage at the second conduction terminal of the third transistor; and
   a switch element that selectively connects the first voltage reference to the control terminals of the second and fourth transistors.

14. An audio signal switch as claimed in claim 7 wherein the second conduction terminal of the first transistor is an emitter and the control terminal of the second transistor is a base such that the conduction path of the first diode extends between the emitter of the first transistor and the base of the second transistor.

15. An audio device, comprising:
   a plurality of audio input sources that supply respective audio signals;
   an output device that outputs sound according to the audio signals; and an audio signal switch that includes:
a plurality of input terminals connected to the audio input sources, respectively,
an output terminal connected to the output device; and
first and second transmission chains connecting the input terminals, respectively, to the output, each transmission chain including:
- a bipolar first transistor connected to the respective input terminal and having a base-emitter junction;
- a bipolar second transistor connected to the output terminal;
- a bipolar intermediate transistor connected between said first and second transistors, wherein said first and second transistors are arranged in an emitter-follower circuit configuration, and said intermediate transistor is arranged to act as a diode to protect the first transistor from a large reverse voltage applied to its base-emitter junction; and
- a first current source coupled between a first voltage supply terminal and a first node at which the intermediate transistor is coupled to an emitter of the first transistor to maintain an operative bias condition, the intermediate transistor having a conduction path extending between the emitter of the first transistor and a second node at which the intermediate transistor is coupled to a base of the second transistor.

16. The audio device of claim 15, wherein the first transistor is of a first conductivity type and the second and intermediate transistors are of a second conductivity type, opposite to the first conductivity type.

17. The audio device of claim 15, further comprising a first current source connected between the first transistor and a voltage reference and structured to maintain the first transistor in an operative bias condition.

18. The audio device of claim 17, wherein the intermediate transistor is coupled to the second transistor at an intermediate node, further comprising a second current source connected between the intermediate node and the voltage reference, the first and second current sources being sized such that the second current source provides a current that is at least an order of magnitude greater than a current provided by the first current source.

19. The audio device of claim 17 wherein the audio signal switch further includes a switch element connected between a voltage reference and respective control terminals of the second transistors of the first and second transmission chains, the switch element being structured to selectively electrically connect the voltage reference to one of the control terminals of the second transistors.

* * * * *